(12) United States Patent
Chou et al.

(10) Patent No.: US 11,424,408 B2
(45) Date of Patent: Aug. 23, 2022

(54) RERAM STRUCTURE AND METHOD OF FABRICATING THE SAME

(71) Applicant: UNITED MICROELECTRONICS CORP., Hsin-Chu (TW)

(72) Inventors: Shih-Min Chou, Tainan (TW); Kuo-Chih Lai, Tainan (TW); Wei-Ming Hsiao, Tainan (TW); Hui-Ting Lin, Chiayi County (TW); Szu-Yao Yu, Tainan (TW); Nien-Ting Ho, Tainan (TW); Hsin-Fu Huang, Tainan (TW); Chin-Fu Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/384,817

(22) Filed: Jul. 26, 2021

(65) Prior Publication Data
US 2021/0351347 A1    Nov. 11, 2021

Related U.S. Application Data

(62) Division of application No. 16/576,784, filed on Sep. 20, 2019, now Pat. No. 11,165,019.

(30) Foreign Application Priority Data

Aug. 23, 2019 (CN) .......................... 201910784725.7

(51) Int. Cl.
*H01L 21/02* (2006.01)
*H01L 45/00* (2006.01)

(52) U.S. Cl.
CPC .......... *H01L 45/1233* (2013.01); *H01L 45/08* (2013.01); *H01L 45/1608* (2013.01)

(58) Field of Classification Search
CPC . H01L 45/1233; H01L 45/08; H01L 45/1608; H01L 45/04; H01L 45/146; H01L 45/1666; H01L 27/2436; H01L 45/12; H01L 45/00; H01L 45/1253; H01L 45/16; H01L 2924/1434; H01L 2924/143; H01L 21/8229; H01L 27/10; H01L 27/222; H01L 27/24; H01L 29/685; H01L 29/792; H01L 29/8615; H01L 2027/11838
See application file for complete search history.

(56) References Cited

U.S. PATENT DOCUMENTS

| | | | |
|---|---|---|---|
| 9,054,308 B1 | 6/2015 | Zhang | |
| 10,153,432 B2 | 12/2018 | Zhu | |
| 2006/0110878 A1* | 5/2006 | Lung | ..................... H01L 45/124 438/704 |
| 2009/0065758 A1 | 3/2009 | Chao | |

(Continued)

*Primary Examiner* — Samuel Park
(74) *Attorney, Agent, or Firm* — Winston Hsu

(57) ABSTRACT

An ReRAM structure includes a dielectric layer. A first ReRAM and a second ReRAM are disposed on the dielectric layer. The second ReRAM is at one side of the first ReRAM. A trench is disposed in the dielectric layer between the first ReRAM and the second ReRAM. The first ReRAM includes a bottom electrode, a variable resistive layer and a top electrode. The variable resistive layer is between the bottom electrode and the top electrode. A width of the bottom electrode is smaller than a width of the top electrode. The width of the bottom electrode is smaller than a width of the variable resistive layer.

7 Claims, 5 Drawing Sheets

(56) References Cited

U.S. PATENT DOCUMENTS

| | | | |
|---|---|---|---|
| 2009/0200534 A1* | 8/2009 | Rajendran | H01L 29/8613 438/479 |
| 2011/0068313 A1* | 3/2011 | Liu | H01L 45/06 438/129 |
| 2013/0224931 A1* | 8/2013 | Sorada | H01L 45/16 438/382 |
| 2015/0295172 A1 | 10/2015 | Sung | |
| 2017/0117467 A1 | 4/2017 | Chang | |
| 2020/0350498 A1 | 11/2020 | Ohba | |

* cited by examiner

US 11,424,408 B2

1

RERAM STRUCTURE AND METHOD OF FABRICATING THE SAME

CROSS REFERENCE TO RELATED APPLICATIONS

This patent application is a divisional application of and claims priority to U.S. patent application Ser. No. 16/576,784, filed on Sep. 20, 2019, and entitled "ReRAM STRUCTURE AND METHOD OF FABRICATING THE SAME" the entire contents of which are incorporated herein by reference.

BACKGROUND OF THE INVENTION

1. Field of the Invention

The present invention relates to a resistive random access memory (ReRAM) structure and a method of fabricating the same, and more particularly to an ReRAM structure which can prevent current leakage and a method of fabricating the same.

2. Description of the Prior Art

Nonvolatile memory is capable of retaining the stored information even when unpowered. Non-volatile memory may be used for secondary storage or long-term persistent storage. Resistive Random Access Memory (ReRAM) technology has been gradually recognized as having exhibited those semiconductor memory advantages.

ReRAM cells are non-volatile memory cells that store information by changes in electric resistance, not by changes in charge capacity. In general, the resistance of the resistive layer varies according to an applied voltage. An ReRAM cell can be in a plurality of states in which the electric resistances are different. Each different state may represent a digital information. The state can be changed by applying a pre-determined voltage or current between the electrodes. A state is maintained as long as a predetermined operation is not performed.

However, the manufacturing process of the ReRAM often causes current leakage.

SUMMARY OF THE INVENTION

In light of the above, the present invention provides a structure and a method to prevent the current leakage of an ReRAM.

According to a preferred embodiment of the present invention, an ReRAM structure includes a dielectric layer. A first ReRAM is disposed on the dielectric layer. The first ReRAM includes a bottom electrode, a top electrode, and a variable resistive layer disposed between the top electrode and the bottom electrode. A width of the bottom electrode is smaller than a width of the top electrode. The width of the bottom electrode is smaller than a width of the variable resistive layer. A second ReRAM is disposed on the dielectric layer and at one side of the first ReRAM. A trench is disposed in the dielectric layer between the first ReRAM and the second ReRAM.

According to a preferred method of an ReRAM structure includes providing a dielectric layer. Then, a mask layer is formed to cover the dielectric layer. Part of the mask layer is removed to form a first recess and a second recess within the mask layer. Later, a first bottom electrode and a second

2 bottom electrode are formed, wherein the first bottom electrode is disposed in the first recess, and the second bottom electrode is disposed in the second recess. Subsequently, a trench is formed in the mask layer between the first bottom electrode and the second bottom electrode and in the dielectric layer. Next, a variable resistive material layer and a top electrode material layer are formed in sequence to cover the mask layer, the first bottom electrode and the second bottom electrode, wherein the variable resistive material layer covering the first bottom electrode serves as a first variable resistive layer, the top electrode material layer covering the first bottom electrode serves as a first top electrode, a width of the first bottom electrode is smaller than a width of the first top electrode, and the width of the first bottom electrode is smaller than a width of the first variable resistive layer. Finally, a protective layer is formed to cover and contact the top electrode material layer and a sidewall of the trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict an ReRAM structure and a method of fabricating an ReRAM structure according to a preferred embodiment of the present invention, wherein:

FIG. 1 depicts a dielectric layer covered by a mask layer;
FIG. 2 depicts a stage following FIG. 1;
FIG. 3 depicts a stage following FIG. 2;
FIG. 4 depicts a stage following FIG. 3;
FIG. 5 depicts a stage following FIG. 4;
FIG. 6 depicts a stage following FIG. 5;
FIG. 7 depicts a stage following FIG. 6;
and
FIG. 8 depicts a stage following FIG. 7.

DETAILED DESCRIPTION

FIG. 1 to FIG. 8 depict an ReRAM structure and a method of fabricating an ReRAM structure according to a preferred embodiment of the present invention.

Figure 1:
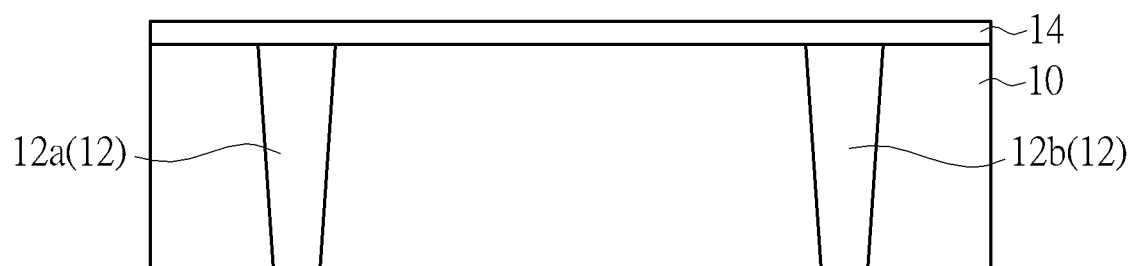

As shown in FIG. 1, a dielectric layer 10 is provided. A metal interconnection 12 such as a contact plug 12a and a contact plug 12b is disposed within the dielectric layer 10. The dielectric layer 10 can be silicon oxide, silicon nitride, silicon carbon nitride, silicon oxynitride or silicon oxycarbonitride. Next, a mask layer 14 is formed to cover the dielectric layer 10. The mask layer 14 may be silicon nitride. The metal interconnection 12 can be copper, aluminum, tungsten or other conductive materials.

Figure 2:
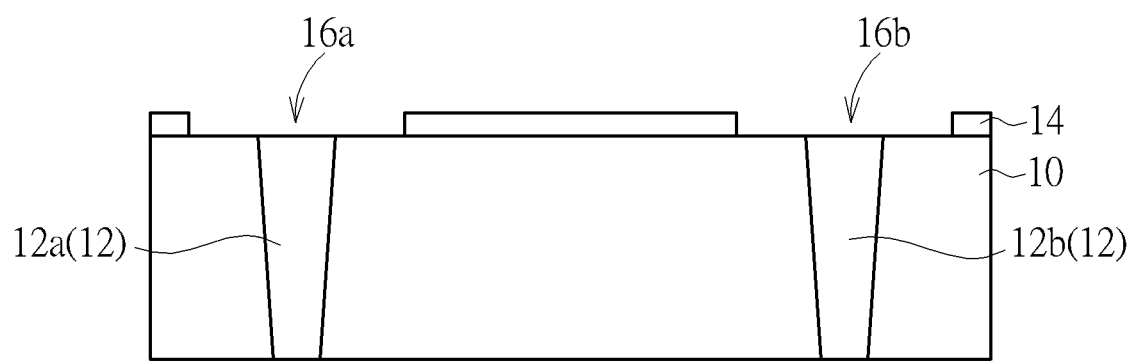
Figure 3:
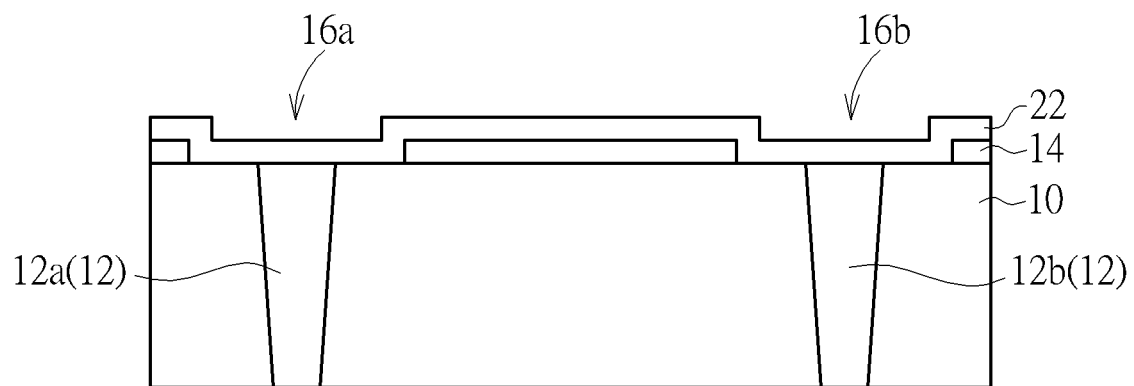

As shown in FIG. 2, the mask layer 14 is patterned to remove part of the mask layer 14 and to form a first recess 16a and a second recess 16b in the mask layer 14. The first recess 16a and the second recess 16b penetrate the mask layer 14. Moreover, the contact plug 12a is exposed through the first recess 16a, and the contact plug 12b is exposed through the second recess 16b. As shown in FIG. 3, a bottom electrode material layer 22 is formed to cover the mask layer 14 and fill up the first recess 16a and the second recess 16b. The bottom electrode material layer 22 includes titanium nitride, tantalum nitride or other conductive materials. The method of forming the bottom electrode material layer 22 is preferably through a physical deposition process.

Figure 4:
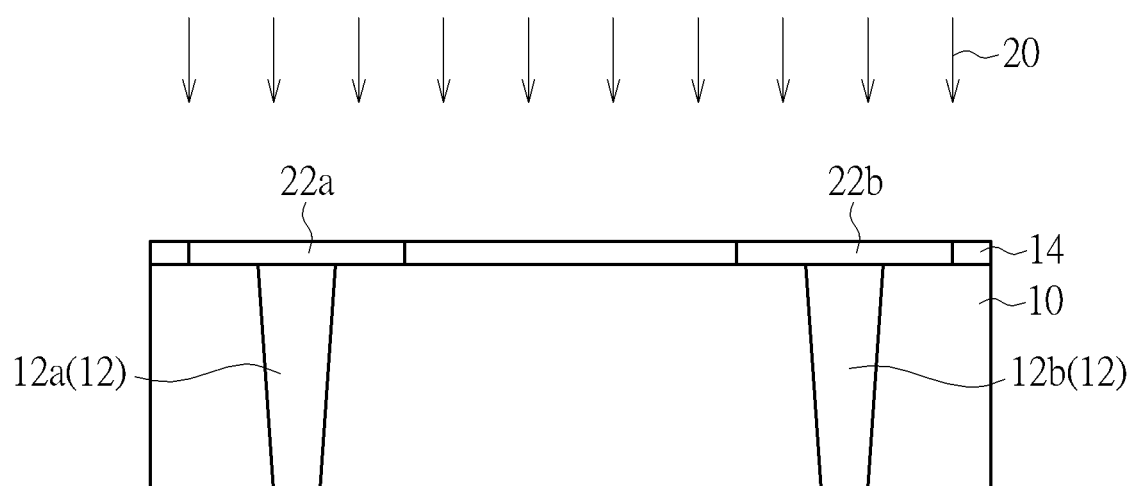

As shown in FIG. 4, a planarization process 20 such as a chemical mechanical polish is performed to remove the bottom electrode material layer 22 outside of the first recess 12a and the second recess 12b. The bottom electrode material layer 22 remained in the first recess 12a serves as a first bottom electrode 22a. The bottom electrode material layer 22 remained in the second recess 12b serves as a second bottom electrode 22b. The first bottom electrode 22a contacts the contact plug 12a. The second bottom electrode 22b contact the contact plug 12b.

Figure 5:
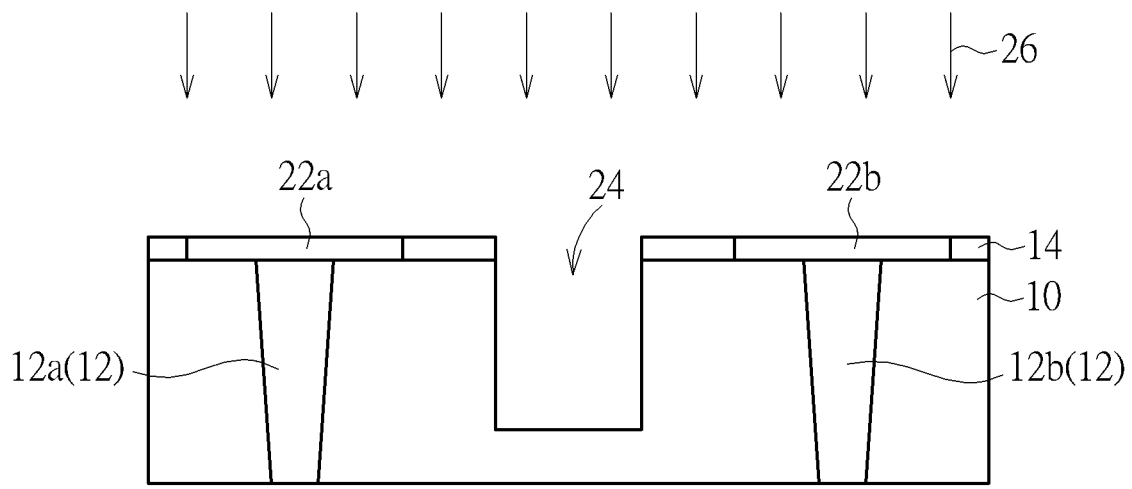
Figure 6:
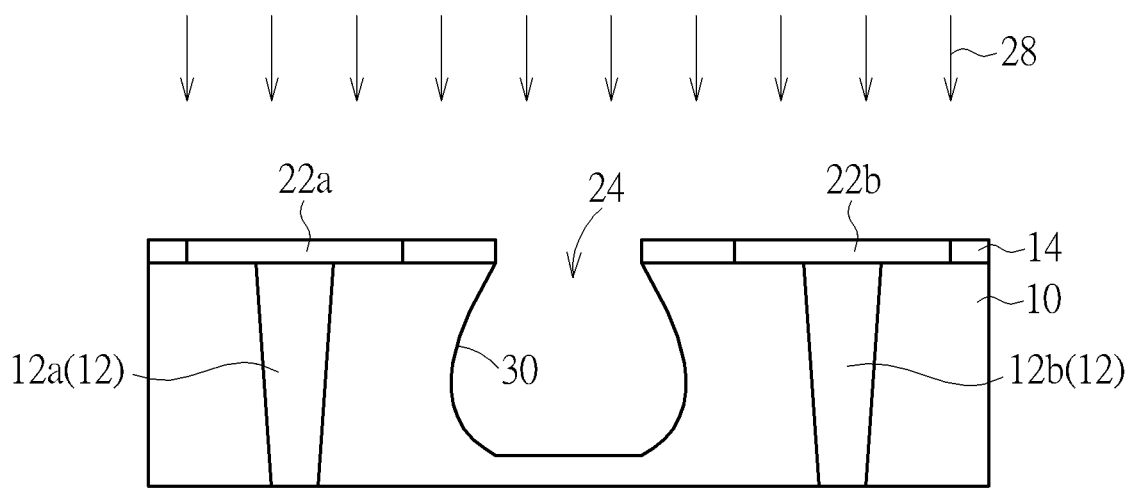
Figure 10:
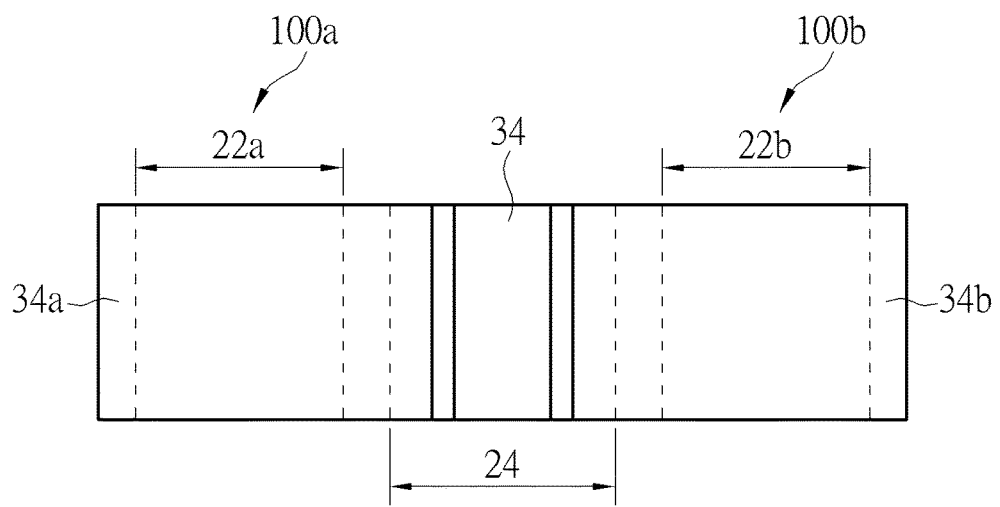
FIG. 10 depicts a top view of a first ReRAM, a second ReRAM and a trench.

As shown in FIG. 5, a trench 24 is formed in the mask layer 14 between the first bottom electrode 22a and the second bottom electrode 22b and in the dielectric layer 10 (please refer to FIG. 10 for the relative positions of the trench 24, the first bottom electrode 22a and the second bottom electrode 22b with respective to a top view). The trench 24 is formed by an anisotropic etching process 26 such as a dry etching process. A sidewall of the trench 24 is vertical. In other words, the sidewall of the trench 24 is flat. As shown in FIG. 6, an isotropic etching process 28 is performed to the trench 24. The isotropic etching process 28 may be a wet etching process. After the isotropic etching process 28, the sidewall of the trench 24 turns into an arc 30 and the bottom of the trench 24 becomes deeper. The arc 30 bends into the dielectric layer 10. According to a preferred embodiment of the present invention, an aspect ratio of the trench 24 is larger than 1.76.

Figure 7:
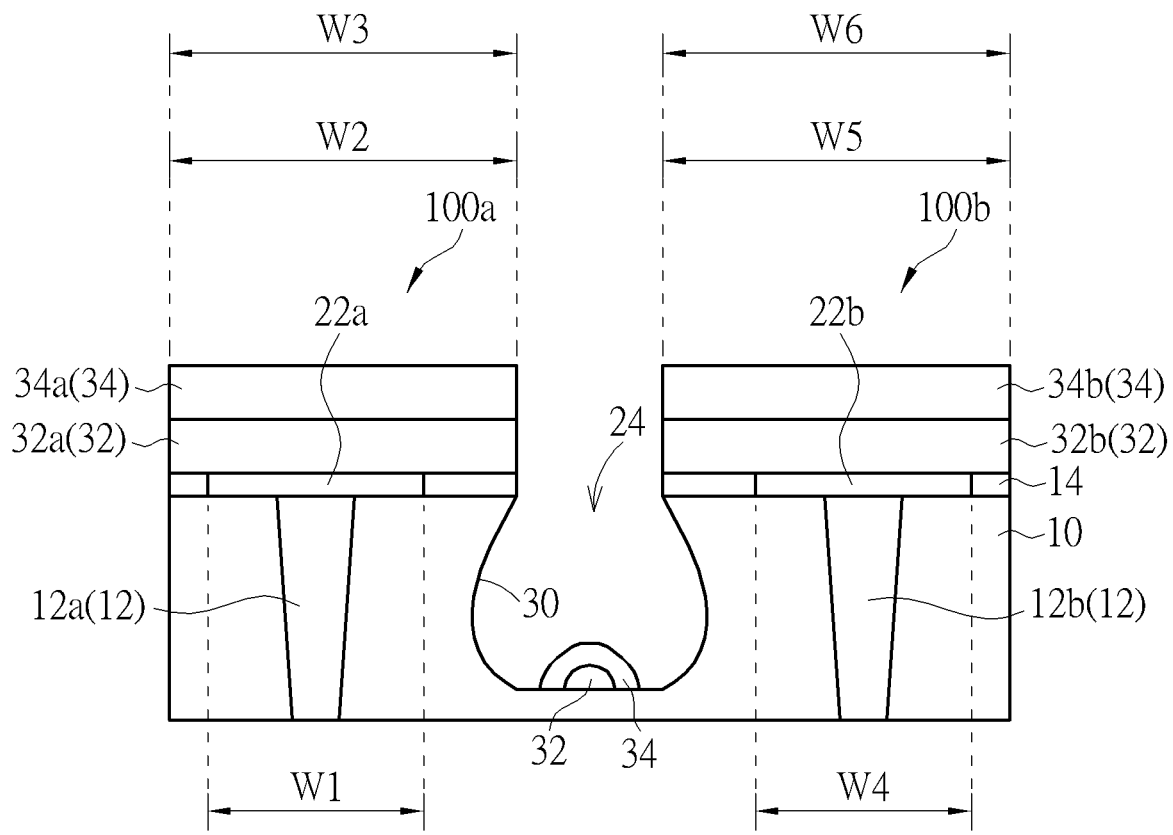

As shown in FIG. 7, a variable resistive material layer 32 is formed to cover the mask layer 14, the first bottom electrode 22a, the bottom of the trench 24 and the second bottom electrode 22b. Later, a top electrode material layer 34 is formed to cover the variable resistive material layer 32. The variable resistive material layer 32 and the top electrode material layer 34 are both formed by physical vapor depositions. The top electrode material layer 34 includes titanium nitride or tantalum nitride, and the variable resistive material layer 32 includes tantalum oxide, hafnium oxide or titanium oxide. A total thickness of the top electrode material layer 34 and the variable resistive material layer 32 is between 500 and 1000 angstroms. It is noteworthy that the present invention specially forms the trench 24 and uses the physical vapor deposition to form the variable resistive material layer 32 and the top electrode material layer 34. Furthermore, the aspect ratio of the trench 24 goes along with the total thickness of the variable resistive material layer 32 and the top electrode material layer 34 to make the variable resistive material layer 32 and the top electrode material layer 34 to form an overhang on the sidewall of the trench 24. Furthermore, the arc 30 formed by the isotropic etching process 28 bends into the dielectric layer 10. Because the trench 24 has the arc 30 and a proper aspect ratio, the variable resistive material layer 32 and the top electrode material layer 34 can't form connective structure on the sidewall of the trench 24. The variable resistive material layer 32 and the top electrode material layer 34 can only be deposited on part of the trench 24 and the bottom of the trench 24. In some cases, the variable resistive material layer 32 and the top electrode material layer 34 can't be deposited on the sidewall of the trench 24. In this way, the variable resistive material layer 32 and the top electrode material layer 34 are separated into three regions to respectively cover the first bottom electrode 22a, the bottom of the trench 24 and the second bottom electrode 22b. In detail, the variable resistive material layer 32 covers the first bottom electrode 22a serves as a first variable resistive layer 32a. The top electrode material layer 34 covers the first bottom electrode 22a serves as a first top electrode 34a. The variable resistive material layer 32 covers the second bottom electrode 22b serves as a second variable resistive layer 32b. The top electrode material layer 34 covers the second bottom electrode 22b serves as a second top electrode 34b. At this point, the first bottom electrode 22a, the first variable resistive layer 32a and the first top electrode 34a forma first ReRAM 100a. The second bottom electrode 22b, the second variable resistive layer 32b and the second top electrode 34b form a second ReRAM 100b. Moreover, a width W1 of the first bottom electrode 22a is smaller than a width W3 of the first top electrode 34a. The width W1 of the first bottom electrode 22a is smaller than a width W2 of the first variable resistive layer 32a. Similarly, a width W4 of the second bottom electrode 22b is smaller than a width W6 of the second top electrode 34b, and the width W4 of the second bottom electrode 22b is smaller than a width W5 of the second variable resistive layer 32b. In addition, the first variable resistive layer 32a and the second variable resistive layer 32b both contact the mask layer 14.

Figure 8:
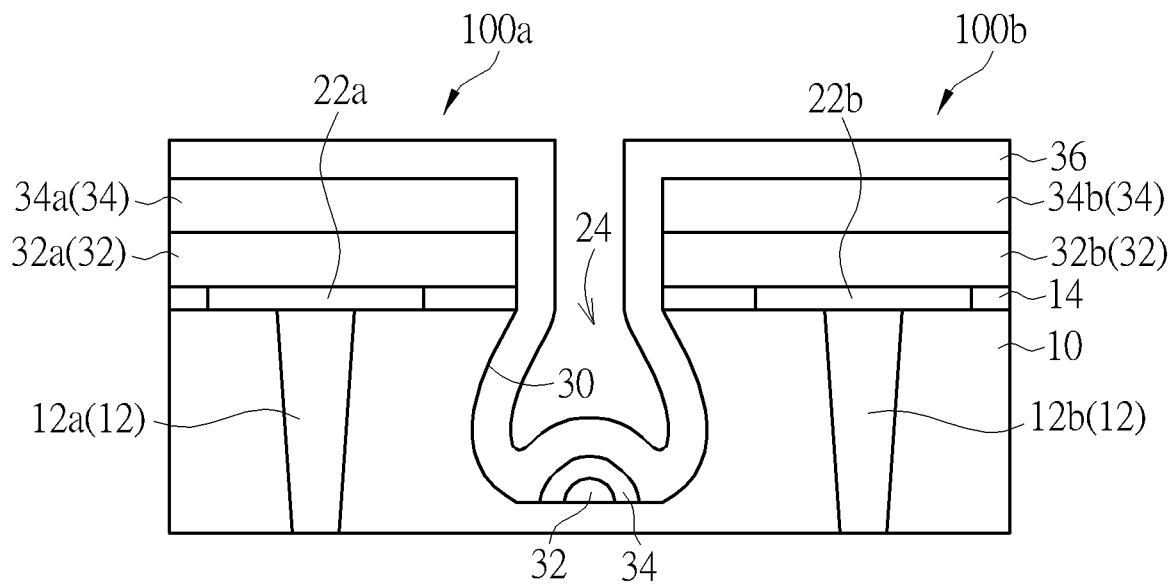

As shown in FIG. 8, a protective layer 36 is formed to cover and contact the top electrode material layer 34 and the sidewall of the trench 24. The protective layer 36 is preferably formed by a chemical vapor deposition. The protective layer 36 directly contacts the sidewall of the trench 24 which is not covered by the variable resistive material layer 32 and the top electrode material layer 34. Therefore, the protective layer 36 electrically isolates the first ReRAM 100a, the second ReRAM 100b, the variable resistive material layer 32 and the top electrode material layer 34 from each other. The protective layer 36 can be silicon nitride, silicon oxide, silicon oxynitride, silicon carbon nitride or other insulating materials.

Figure 9:
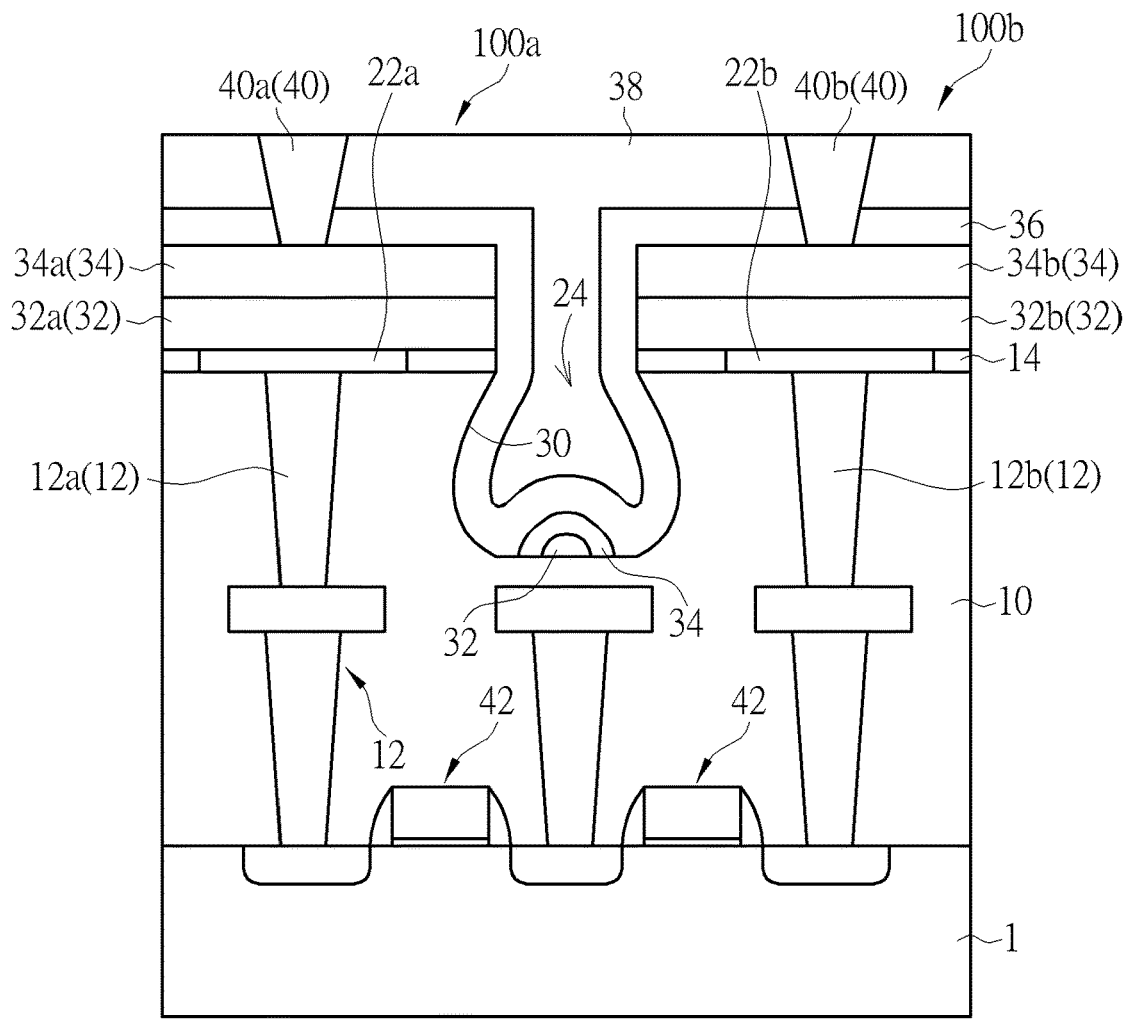
FIG. 9 depicts an ReRAM structure according to a preferred embodiment of the present invention.

As shown in FIG. 9, a dielectric layer 38 is formed to cover the protective layer 36. Then, a metal interconnection 40 is formed in the dielectric layer 38. The metal interconnection includes a contact plug 40a and a contact plug 40b. The contact plug 40a contacts and electrical connects to the first top electrode 34a. The contact plug 40b contacts and electrical connects to the second top electrode 34b. The metal interconnection 40 may be copper, aluminum, tungsten or other conductive materials. Furthermore, the first ReRAM 100a and the second ReRAM 100b can couple to the transistor 42 through the metal interconnection 12. However, the first ReRAM 100a and the second ReRAM 100b can be electrically connected to each other in other ways, not limited to the method mentioned above.

FIG. 9 depicts an ReRAM structure according to a preferred embodiment of the present invention. FIG. 10 depicts a top view of a first ReRAM, a second ReRAM and a trench.

Please refer to FIG. 9 and FIG. 10. A substrate 1 is provided. A transistor 42 is disposed on the substrate 1. The dielectric layer 10 covers the substrate 1. A metal interconnection 12 is disposed in the dielectric layer 10. A trench 24 is embedded in the dielectric layer 10 between the first ReRAM 100a and the second ReRAM 100b. The first ReRAM 100a includes a first bottom electrode 22a, a first top electrode 34a and a first variable resistive layer 32a. The first variable resistive layer 32a is between the first bottom electrode 22a and the first top electrode 34a. Please also refer to FIG. 7. The width W1 of the first bottom electrode 22a is smaller than the width W3 of the first top electrode 34a. The width W1 of the first bottom electrode 22a is smaller than the width W2 of the first variable resistive layer 32a. The second ReRAM 100b includes a second bottom electrode 22b, a second top electrode 34b and a second variable resistive layer 32b. The second variable resistive layer 32b is between the second bottom electrode 22b and the second top electrode 34b. The width W4 of the second bottom electrode 22b is smaller than the width W6 of the second top electrode 34b, and the width W4 of the second bottom electrode 22b is smaller than the width W5 of the second variable resistive layer 32b.

Moreover, a mask layer 14 contacts the dielectric layer 10 and is disposed at two sides of the first bottom electrode 22a and two sides of the second bottom electrode 22b. The top surface of the first bottom electrode 22a, the top surface of the second bottom electrode 22b and the top surface of the mask layer 14 are aligned with each other. As shown in FIG. 10, part of the first top electrode 34a overlaps the trench 24. But, the first bottom electrode 22a does not overlap the trench 24. Likewise, the part of the second top electrode 34b overlaps the trench 24. But, the second bottom electrode 22b does not overlap the trench 24.

A variable resistive material layer 32 covers a bottom of the trench 24, wherein a material of the variable resistive material layer 32 and a material of the first variable resistive layer 32a and a material of the second variable resistive layer 32b are the same. A top electrode material layer 34 covers the variable resistive material layer 32, wherein a material of the top electrode material layer 34 and a material of the first top electrode 34a and a material of the second top electrode 34b are the same. It is noteworthy that the variable resistive material layer 32, the first variable resistive layer 32a, and the second variable resistive layer 32b do not connect to each other. The top electrode material layer 34, the first top electrode 34a, and the second top electrode 34b do not connect to each other.

Moreover, part of the sidewall of the trench 24 is not covered by the variable resistive material layer 32. Similarly, part of the sidewall of the trench 24 is not covered by the top electrode material layer 34. A protective layer 36 covers the first ReRAM 100a and the second ReRAM 100b and contacts the sidewall of the trench 24 which is not covered by the variable resistive material layer 32. The sidewall of the trench 24 is in a shape of an arc 30. The arc 30 bends into the dielectric layer 10. The aspect ratio of the trench 24 is greater than 1.76. The total thickness of the first top electrode 34a and the first variable resistive layer 32a is between 500 and 1000 angstroms. The total thickness of the second top electrode 34b and the second variable resistive layer 32b is between 500 and 1000 angstroms. The first bottom electrode 22a and the second bottom electrode 22b respectively include titanium nitride or tantalum nitride. The first top electrode 34a and the second top electrode 34b respectively include titanium nitride or tantalum nitride. The first variable resistive layer 32a and the second variable resistive layer 32b respectively include tantalum oxide, hafnium oxide or titanium oxide. The protective layer 36 may be silicon nitride, silicon oxide, silicon oxynitride, silicon carbon nitride or other insulating materials.

A metal interconnection 40 includes a contact plug 40a and a contact plug 40b. The contact plug 40a contacts and electrical connects to the first top electrode 34a. The contact plug 40b contacts and electrical connects to the second top electrode 34b. The contact plug 12a of the metal interconnection 12 contacts and electrical connects to the first bottom electrode 22a. The contact plug 12b of the metal interconnection 12 contacts and electrical connects to the second bottom electrode 22b.

The conventional process fabricates ReRAM by depositing the bottom electrode material layer, the variable resistive layer, and the top electrode material layer in sequence. Later, the position of the ReRAM is defined by an etching process. However, the conventional process causes damages on the bottom electrode material layer, the variable resistive layer, and the top electrode material layer during the etching process. Then, the ReRAM formed by the conventional process will have a current leakage path between the top electrode and the bottom electrode. On the other hand, the present invention takes advantage of the physical vapor deposition having an overhang effect on the sidewall of the trench with a high aspect ratio to form the top electrode and the variable resistive layer without using any etching process. Furthermore, the bottom electrode of the present invention is formed by filling a conductive material layer into recesses followed by a planarization. Therefore, the formation of the bottom electrode of the present invention does not using any etching process. As a result, the current leakage can be prevented in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a resistive random access memory (ReRAM) structure, comprising:
    providing a dielectric layer;
    forming a mask layer covering the dielectric layer;
    removing part of the mask layer to form a first recess and a second recess within the mask layer;
    forming a first bottom electrode and a second bottom electrode, wherein the first bottom electrode is disposed in the first recess, and the second bottom electrode is disposed in the second recess;
    forming a trench in the mask layer between the first bottom electrode and the second bottom electrode and in the dielectric layer;
    forming a variable resistive material layer and a top electrode material layer in sequence to cover the mask layer, the first bottom electrode and the second bottom electrode,
    wherein a first portion of the variable resistive material layer covering the first bottom electrode serves as a first variable resistive layer, a first portion of the top electrode material layer covering the first bottom electrode serves as a first top electrode, a width of the first bottom electrode is smaller than a width of the first top electrode, the width of the first bottom electrode is smaller than a width of the first variable resistive layer; and
    forming a protective layer covering and contacting the top electrode material layer and a sidewall of the trench.

2. The fabricating method of an ReRAM structure of claim 1, wherein the variable resistive material layer and the top electrode material layer cover a bottom of the trench, and part of the sidewall of the trench is not covered by the variable resistive material layer and the top electrode material layer.

3. The fabricating method of an ReRAM structure of claim 1, wherein the variable resistive material layer and the top electrode material layer are formed by physical vapor depositions.

4. The fabricating method of an ReRAM structure of claim 1, wherein the steps of forming the trench comprises an isotropic etching process followed by an anisotropic etching process.

5. The fabricating method of an ReRAM structure of claim 1, wherein a second portion of the variable resistive material layer covering the second bottom electrode serves as a second variable resistive layer, a second portion of the top electrode material layer covering the second bottom electrode serves as a second top electrode, a width of the second bottom electrode is smaller than a width of the second top electrode, the width of the second bottom electrode is smaller than a width of the second variable resistive layer.

6. The fabricating method of an ReRAM structure of claim 1, wherein an aspect ratio of the trench is larger than 1.76.

7. The fabricating method of an ReRAM structure of claim 1, wherein the protective layer is formed by a chemical vapor deposition.

* * * * *